(12) United States Patent
Tu (10) Patent No.: US 10,876,903 B2
(45) Date of Patent: Dec. 29, 2020

(54) MULTI-PURPOSE MEMS THERMOPILE SENSORS

(71) Applicant: Xiang Zheng Tu, San Jose, CA (US)

(72) Inventor: Xiang Zheng Tu, San Jose, CA (US)

( * ) Notice: Subject to any disclaimer, the term of this patent is extended or adjusted under 35 U.S.C. 154(b) by 103 days.

(21) Appl. No.: 16/359,997

(22) Filed: Mar. 20, 2019

(65) Prior Publication Data
US 2020/0300711 A1    Sep. 24, 2020

(51) Int. Cl.
| | | |
|---|---|---|
| *B81C 1/00* | (2006.01) | |
| *H01L 35/04* | (2006.01) | |
| *H01L 35/34* | (2006.01) | |
| *G01K 7/02* | (2006.01) | |
| *G01L 21/12* | (2006.01) | |
| *G01J 5/12* | (2006.01) | |
| *G01F 1/684* | (2006.01) | |

(52) U.S. Cl.
CPC .......... *G01K 7/028* (2013.01); *B81C 1/00182* (2013.01); *G01F 1/6845* (2013.01); *G01J 5/12* (2013.01); *G01L 21/12* (2013.01); *H01L 35/04* (2013.01); *H01L 35/34* (2013.01); *B81C 2201/0115* (2013.01)

(58) Field of Classification Search
CPC ............................ B81C 1/00182; H01L 35/34
See application file for complete search history.

(56) References Cited

U.S. PATENT DOCUMENTS 9,212,940 B2   12/2015  Tu
9,412,927 B2   8/2016   Emadi et al.
(Continued)

FOREIGN PATENT DOCUMENTS

EP    2488054 B1    4/2013

OTHER PUBLICATIONS

D. Randjelovic, A. Petropoulos, G. Kaltsas, M. Stojanovic, Z. Lazic, Z. Djuric, and M. Matic, "Multipurpose MEMS thermal sensor based on thermopiles," in Sensors and Actuators A: Physical, vol. 141, Feb. 15, 2008, pp. 404-413.
(Continued)

*Primary Examiner* — Moazzam Hossain
(74) *Attorney, Agent, or Firm* — JW Law Group; James M. Wu (57) ABSTRACT

A multi-purpose Micro-Electro-Mechanical Systems (MEMS) thermopile sensor able to use as a thermal conductivity sensor, a Pirani vacuum sensor, a thermal flow sensor and a non-contact infrared temperature sensor, respectively. The sensor comprises a rectangular membrane created in a silicon substrate which has a thin polysilicon layer and a thin residual thermal reorganized porous silicon layer both attached on its back side, and configured to have its three sides clamped to the frame formed in the silicon substrate which surrounds and supports the membrane and the other side free to the frame, a cavity created in the silicon substrate, positioned under the membrane and having its flat bottom opposite to the membrane, its three side walls shaped as curved planes and the other side wall shaped as a vertical plane, a heater or an infrared absorber positioned on the membrane, close to and parallel with the free side of the membrane and a thermopile positioned on the membrane and consists of several thermocouples connected in series and having its hot junctions close to the heater and its cold junctions extended to the frame.

20 Claims, 6 Drawing Sheets

(56) References Cited

U.S. PATENT DOCUMENTS

| | | | |
|---|---|---|---|
| 9,929,333 B1 | 3/2018 | Emadi et al. | |
| 2005/0026321 A1* | 2/2005 | D'Arrigo | B81C 1/00142 |
| | | | 438/53 |
| 2006/0166393 A1* | 7/2006 | Ha | B81C 1/00047 |
| | | | 438/53 |
| 2019/0301906 A1* | 10/2019 | Udrea | G01F 1/698 |

OTHER PUBLICATIONS

M. Gilchrist, "The IQOS heating system," in the slides of Philip Morris International's Presentation before the Tobacco Products Scientific Advisory Committee, Jan. 24, 2018.

* cited by examiner

MULTI-PURPOSE MEMS THERMOPILE SENSORS

FIELD

The present invention relates to a MEMS thermopile sensor and more particularly, to a multi-purpose MEMS thermopile sensor including thermal conductivity sensor, Pirani vacuum sensor, infrared temperature sensor and thermal flow sensor.

BACKGROUND

A thermopile is an electronic device that converts thermal energy into electrical energy. It is composed of several thermocouples connected usually in series or, less commonly, in parallel. Thermocouples operate by measuring the temperature differential from their junction point to the point in which the thermocouple output voltage is measured.

Thermocouples can be connected in series as thermocouple pairs with a junction located on either side of a thermal resistance layer. The output from the thermocouple pair will be a voltage that is directly proportional to the temperature difference across the thermal resistance layer and also to the heat flux through the thermal resistance layer. Adding more thermocouple pairs in series increases the magnitude of the voltage output.

Micro-Electro-Mechanical Systems (MEMS)-based thermopile sensors have experienced rapid developments because of the advances such as miniaturized size, low power consumption, fast response, high sensitivity, good reproduction and feasibility of sensor array integration.

Danijela et al. published a paper entitled as "Multipurpose MEMS thermal sensor based on thermopiles" (Sensors and Actuators A: Physical, Volume 141, 15 Feb. 2008, Pages 404-413). This paper presents design, fabrication and experimental results of multipurpose thermopile based sensor which was realized using post-etching bulk micromachining techniques. Thermal isolation is assured using back etching of bulk silicon. Thermopiles have multilayer structure and sandwich membrane consists of layer of residual n-Si and sputtered oxide. Post-etching technique was developed and functional structures with membranes below 3 μm were fabricated.

U.S. Pat. No. 9,212,940 describes a vacuum-cavity-insulated flow sensor and related fabrication method. The sensor comprises a porous silicon wall with numerous vacuum-pores which is created in a silicon substrate, a porous silicon membrane with numerous vacuum-pores which is surrounded and supported by the porous silicon wall, and a cavity with a vacuum-space which is disposed beneath the porous silicon membrane and surrounded by the porous silicon wall. The fabrication method includes porous silicon formation and silicon polishing in HF solution.

U.S. Pat. No. 9,929,333 describes an IR thermopile sensor with temperature reference formed in front-end process. The sensor package having a thermopile sensor and a reference thermopile sensor disposed therein. In one or more implementations, the sensor package includes a substrate, a thermopile sensor disposed over the substrate, a reference thermopile sensor disposed over the substrate, and a lid assembly disposed over the thermopile sensor and the reference thermopile sensor. The lid assembly includes a transparent structure that passes electromagnetic radiation occurring in a limited spectrum of wavelengths and an electromagnetic blocker disposed over the lid assembly. The electromagnetic blocker defines an aperture over the thermopile sensor such that at least a portion of the electromagnetic blocker is positioned over the reference thermopile sensor. The electromagnetic blocker is configured to at least substantially block the electromagnetic radiation occurring in a limited spectrum of wavelengths from reaching the reference thermopile sensor.

U.S. Pat. No. 9,412,927 describes techniques to form an absorption stack proximate to a thermopile sensor utilizing a complementary metal-oxide-semiconductor (CMOS) semiconductor process. In one or more implementations, a thermopile sensor is formed proximate to a semiconductor wafer. An absorption stack is formed proximate to the semiconductor wafer and includes a first layer, a second layer, and a third layer. The first layer may be a material having absorption and/or reflective characteristics. The second layer may be a material having wave phase shift characteristic characteristics. The third layer may be a material having a reflective characteristic, which may be proximal to the semiconductor wafer (e.g., silicon substrate) with respect to the first and second layers.

Danijela et al., technique is not acceptable because the fabricated bulk-micromachining process is quite complicated which lower the yield and increase the cost of the sensors. The other US Patents' techniques have several limitations of the fabrication processes or device structures. The performance of the sensor is far from being optimized which includes sensitivity, response time, power consumption and fabrication cost.

SUMMARY

In one feature, the present invention is to provide a multi-purpose Micro-Electro-Mechanical Systems (MEMS) thermopile sensor comprising a rectangular membrane created in a silicon substrate which has a thin silicon layer and a thin residual thermal reorganized porous silicon layer attached on its backside, and configured to make its three sides clamped to the frame formed in the silicon substrate and the other side free to the frame, a cavity created in the silicon substrate, positioned under the membrane, having a depth ranging from 15 to 50 micron and a flat bottom opposite to the membrane so as to form a one-dimensional heat conduction transfer space wherein the temperature distribution depending on one variable only and having three side walls shaped as curved planes and the other side wall shaped as a vertical plane, a heater positioned on the membrane, near and parallel with the free side of the membrane and a thermopile positioned on the membrane and consists of several thermocouples connected in series and having its hot junctions close to the heater and its cold junctions extended to the edge of the frame.

In another feature, the present invention is to utilize the isotropy profile and the selectivity of the porous silicon etching process for creating low power consumption micro-heaters operated at elevated temperature.

In another feature, the multi-purpose MEMS thermopile sensor is packaged in an open air cavity such as a TO-8 package with a top mesh cap and the cavity of the sensor is filled with a gas similar to the surrounding gas so that the temperature of the hot junctions will be changed by thermal conduction and the sensor can be used to measure the thermal conductivity of the gas or the component concentration of the gas.

In another feature, the multi-purpose MEMS thermopile sensor is packaged in a vacuum system and the cavity of the sensor is pumped to a vacuum so that the temperature of the hot junctions will be changed by thermal conduction and the sensor can be operated as a Pirani vacuum sensor for vacuum measurement.

In another feature, the multi-purpose MEMS thermopile sensor is packaged in a gas laminar flow system with an inlet and an outlet and the gas flow is configured to pass across the membrane of the sensor so that the temperature of the hot junctions will be changed by thermal convection and the sensor can be used to measure the gas flow rate.

Other systems, methods, features and advantages of the embodiments will be, or will become, apparent to one of ordinary skill in the art upon examination of the following figures and detailed description. It is intended that all such additional systems, methods, features and advantages be included within this description and this summary, be within the scope of the embodiments, and be protected by the following claims.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

While various embodiments have been described, the description is intended to be exemplary, rather than limiting and it will be apparent to those of ordinary skill in the art that many more embodiments and implementations are possible that are within the scope of the embodiments herein. Accordingly, the embodiments are not to be restricted except in light of the attached claims and their equivalents. Also, various modifications and changes may be made within the scope of the attached claims.

Figure 1:
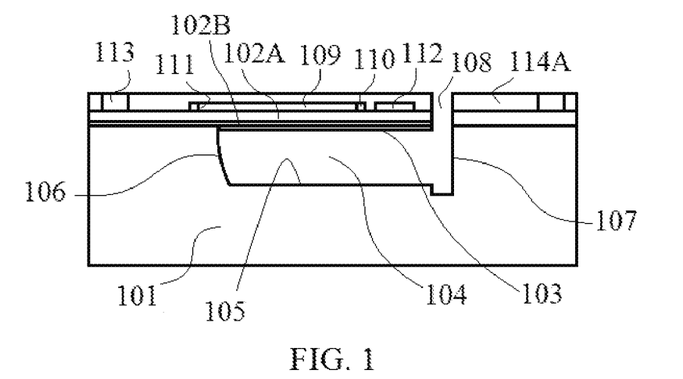
FIG. 1 illustrates the perspective, partially cross-sectional, and diagrammatic sketch of a multi-purpose MEMS thermopile sensor which can be respectively configured as a gas conductivity sensor, a Pirani vacuum sensor and a gas flow sensor.

Reference to the FIG. 1, it shows a cross-sectional view of a multi-purpose MEMS thermopile sensor able to use as a thermal conductivity sensor, a Pirani vacuum sensor or a thermal flow sensor. The sensor comprises a silicon substrate 101, a rectangular membrane 102A positioned on the surface of the substrate and having its three sides fixed at a frame formed in the substrate and the other side free, a thin polysilicon layer 102B and a thin residual reorganized porous silicon film 103 attached to the back side of the membrane, a cavity 104 positioned under the membrane having a depth ranging from 15 to 50 micron and a flat bottom opposite to the membrane so as to form a one-dimensional heat conduction transfer space wherein the temperature distribution depending on one variable only and having a flat bottom 105, three curved side walls 106, and a vertical side wall 107, a notch 108 which is created by partial cutting of the substrate along a side wall and down to the bottom of the cavity, a thermopile 109 positioned on the membrane and having its hot junctions 110 close to the free side of the membrane and its cold junctions 111 extending to the edge of the frame, a heater 112 positioned along the edge of the free side of the membrane and close to the hot junctions of the thermopile, several bong pads 113 positioned along the edge of the substrate, and a passivation layer 114 protecting the surface of the sensor.

The membrane 102A is made of a dielectric layer such as silicon nitride layer or a dielectric stack layer consisting of silicon nitride/silicon dioxide/silicon nitride which normally has a lower thermal coefficient and a higher thermal mismatch stress. The thin silicon layer 102B and thin residual thermal reorganized porous silicon layer 103 have a similar thermal coefficient to the silicon substrate and therefore is able to reduce the influence of the thermal mismatch stress of the membrane 102 and the substrate 101.

The thin residual thermal reorganized porous silicon layer 103 is formed by high temperature treatment of the porous silicon layer at 800-1000° C. in pure hydrogen which leads the surface of the porous silicon layer to be partially crystallized and consist of spherical voids of 50 to 500 nm.

The cavity 104 is created by selective etching of the porous silicon layer which grows in isotropy direction in a uniformly doped silicon substrate so as to form curved side walls 106 and a flat bottom 105. Compare with KOH anisotropic etching of silicon, the sidewalls of a resulted cavity are defined by the <110> plane, and the plane is etched at a 54.7° angle relative to the <100> plane.

It is to be noted that the present invention utilizes porous silicon micromachining technology. After forming of porous silicon layer in a silicon substrate additional layers can be deposited and processed. Finally, the porous silicon is etched away with standard Si etchants, such as KOH or TMAH. Due to the high surface/volume ratio of porous silicon highly diluted etchant can be applied at room temperature. A large area of application is the generation of thermally isolated gaps by the aid of porous silicon sacrificial layers. Thick porous silicon sacrificial layers are used to combine the advantages of standard surface micromachining with the advantages of bulk micromachining: no design limitation based on the silicon crystallographic orientation, realization of free standing structures thermally decoupled of the substrate and only front side micromachined. Compared to standard surface micromachining processes the thickness of the sacrificial layer is much higher which solves a number of technological problems around sticking and adhesion of microstructures and thermal isolation and decoupling is much more efficient. The technique has been successfully applied for movable microstructures, such as thermo-mechanically driven cantilevers and suspended membranes for low power thin-film gas sensor arrays operated at high temperatures. The technology has the potential to replace standard wet chemical anisotropic etching of bulk silicon in a number of applications. In addition to the advantages mentioned above, the process requires a minimum footprint for the MEMS structure and the final porous silicon etching can be performed after dicing with the chips on tape. This allows protecting the highly sensitive structures during the harsh dicing process.

The cavity 104 with a flat bottom 105 results a one directional heat transfer between two parallel plates which is helpful to simplify the thermal modeling of the sensor and optimizing the design of the sensor. As a thermal conductivity sensor, the sensitivity of the sensor can be analytical analysis based on Matlab (matrix laboratory) software. Matlab is a multi paradigm numerical computing environment and proprietary programming language developed by MathWorks. Matlab allows matrix manipulations, plotting of functions and data, implementation of algorithms, creation of user interfaces, and interfacing with programs written in other languages, including C, C++, C#, Java, Fortran and Python.

According to Matlab the sensitivity of the sensor can be expressed as a function of the cavity gas path length and the thermopile leg length. There is an optimum value of the cavity gas path length for a thermopile leg length. When the cavity gas path length is rather short, the temperature of heater is greatly influenced by the underneath cold plat bottom, which result in a low sensitivity to the changes in the thermal conductivity of measured gas. When the cavity gas path length is rather long, less heat from the heater will conducted through the gas, and more heat will be lost through the thermopile legs, thus the temperature of heater has a lower sensitivity to the changes in the thermal conductivity of measured gas.

The gap of the cavity 104 can be fabricated as small as 20 μm which means the sensitivity of the sensor is still quite high even the length of the thermopile 109 is reduced as short as 200 μm. The gap of the cavity 104 can be fabricated as large as 50 μm which means the sensitivity of the sensor is still quite high even the length of the thermopile 109 is increased as long as 500 μm.

The vertical side wall 107 of the cavity 104 is created by partial cutting of the sacrifice porous silicon layer along its edge and down to its bottom and then removing the porous silicon layer by selective etching in diluted KOH solution. The thermal reorganized porous silicon layer can be etched by diluted KOH solution but the etch rate decreases from the bottom layer to the top layer so as to leave a thin layer un-etched depending upon the etch time.

Figure 2:
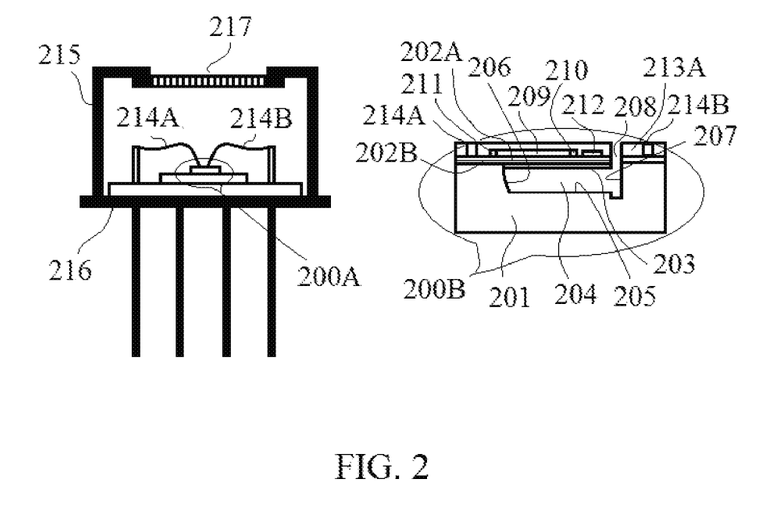
FIG. 2 illustrates the cross-sectional view of a multi-purpose MEMS thermopile sensor configured as a thermal conductivity gas sensor or a Pirani vacuum sensor which is packaged in a TO-5 metal can with a gas communication mesh on the top.

Reference to the FIG. 2, it shows a multi-purpose MEMS thermopile sensor able to use as a thermal conductivity sensor or a Pirani vacuum sensor. The left part of the FIG. 2 illustrates a sensor chip installed in a TO-5 metal can and the right part of the FIG. 2 illustrates an enlarged sensor chip.

The metal can comprise a base 216, a body 215, a mesh 216, a sensor chip 200A and two electrical connection wires 214A and 214B. The sensor chip indicated by 200B comprises a silicon substrate 201, a membrane 202A disposed on the surface of the silicon substrate which has three sides fixed to a frame formed in the silicon substrate and the other side free to the frame, a thin polysilicon layer 202B attached on the back side of the membrane, a thin thermal reorganized porous silicon film 203 attached on the back surface of the thin polysilicon layer, a cavity 204 disposed under the membrane which has a bottom flat surface 205, three curved side walls 206 and a vertical side wall 207 which is formed by partial dicing of the silicon substrate, a notch 208 providing an opening for the cavity to communicate with its surrounding environment, a thermopile 209 having several hot junctions 210 and several cold junctions 211, a heater 212 shaped as a long stripe, two wires 213B and 214B which are the same to 214A and 214B in the left part of the FIG. 2.

The thermal conductivity gas sensor measures the thermal conductivity of a gas mixture. The hot junctions are heated up by the supplied input electric power. The measured gas transfers a quantity of heat via the thermal conduction of the measured gas from the membrane to the bottom of the cavity, which leads to decrease the temperature of the hot junctions. Thus, the changes in the thermal conductivity of measured gas can be detected by measuring the changes in the temperature of the hot junctions.

The thermal conductivity of a gas mixture is not usually the linear function of its mole fraction. Many techniques have been proposed such as Mason and Saxena modification. All of them are essentially empirical and most of them reduce to some form of the Wassiljewa equation. Therefore, it can be approximated that the thermal conductivity of the target gas mixture equals the thermal conductivity of its components. That is why some gases such as a water vapor, carbon dioxide and methane in an Air, their concentrations can be determined by using a thermal conductivity gas sensor.

The Pirani vacuum sensor actually is another kind of thermal conductivity sensor which is used for the measurement of the pressures in vacuum systems. The heated hot junctions of the thermopile placed in an atmosphere environment lose heat to the environment as the hot junctions collide with the environment molecules and remove heat. If the pressure of the environment is reduced the number of molecules present will fall proportionately and the heat loss becomes an indirect indication of the environment pressure.

Figure 3:
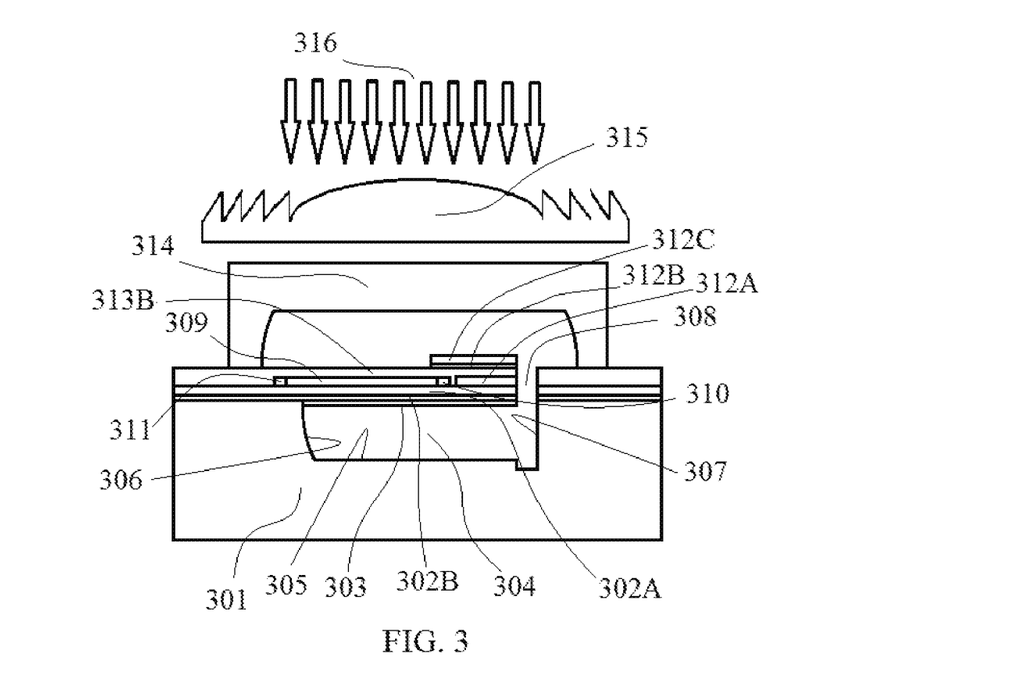
FIG. 3 illustrates the cross-sectional view of a multi-purpose MEMS thermopile sensor configured as a non-contact infrared temperature sensor with an infrared window mounted on the top of the sensor which allows an infrared radiation passing through the window.

Reference to the FIG. 3, it shows a cross-sectional view of a multi-purpose MEMS thermopile sensor able to use as a non-contact infrared temperature sensor. The non-contact infrared temperature sensor infers the temperature from a portion of the thermal radiation sometimes called blackbody radiation emitted by the object being measured. By knowing the amount of infrared energy emitted by the object, the object's temperature can often be determined within a certain range of its actual temperature. The design essentially consists of a lens to focus the infrared thermal radiation on to a sensor, which converts the radiant power to an electrical signal that can be displayed in units of temperature after being compensated for ambient temperature. This permits the temperature measurement from a distance without contact with the object to be measured.

As shown in the FIG. 3, the non-contact infrared temperature sensor comprises a silicon substrate 301, a membrane 302A disposed on the surface of the silicon substrate which has its three sides fixed to the frame formed in a silicon substrate and the other side free to the frame, a thin polysilicon layer 302B attached to the back side of the membrane, a thin reorganized porous silicon layer 303 attached on the back surface of the thin polysilicon layer, a cavity 304 disposed under the membrane which has a flat bottom 305, three curved side walls 306 and a vertical side wall 307, a notch 308 formed by partial cutting of the silicon substrate and being a vent for the cavity to communicate with its surrounding environment, a thermopile 309 disposed on the membrane which has its hot junctions 310 close to the free side of the membrane and its cold junctions 311 extending to the edge of the frame of the silicon substrate, an infrared absorber consisting of 312A, 312B and 312C elements along the edge of the free side of the membrane and extending to the hot junctions, a silicon dioxide layer 313B protecting the surface of the sensor, a silicon infrared window 314 and a Fresnel lens 315 both mounted above the sensor and an infrared radiation 316 illuminating the sensor.

Figure 4:
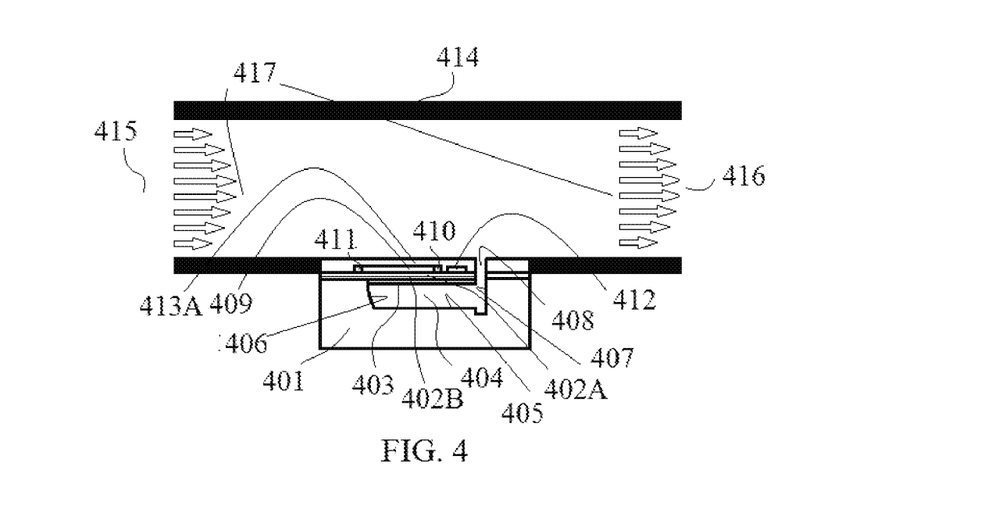
FIG. 4 illustrates the cross-sectional view of a multi-purpose MEMS thermopile sensor configured as a gas flow sensor which is packaged in a gas laminar flow channel system.

A thermal flow sensor is shown in the FIG. 4, which comprises a silicon substrate 401, a membrane 402A disposed on the surface of the silicon substrate, which has its three curved sides wall fixed to the silicon substrate and a vertical side wall free, a thin polysilicon layer 402B attached to the back side of the membrane, a thin thermal reorganized porous silicon film 403 attached to the back surface of the thin polysilicon layer, a cavity 404 having a flat bottom 405, three curved side walls 406 and a vertical side wall 407, a notch 408 formed by a partial cutting of the silicon substrate along the vertical side wall of the cavity and functioned as a vent for the cavity to communicate with its surrounding environment, a thermopile 409 disposed on the membrane and having its hot junctions 410 close to the free side and its cold junctions 411 extending to the frame, a heater 412 disposed along the free side and close to the hot junctions, a gas flow channel 413 with the gas flow sensor disposed on its bottom wall and having an inlet 414 and an outlet 415, a gas laminar flow 416 passing through the surface of the membrane in parallel.

The thermal gas flow sensors measure the mass flow rate of gases directly. Volumetric measurements are affected by all ambient and process conditions that influence unit volume or indirectly affect pressure drop, while mass flow measurement is unaffected by changes in viscosity, density, temperature, or pressure. The thermal mass flow sensors are often used in monitoring or controlling mass-related processes such as chemical reactions that depend on the relative masses of un-reacted ingredients. In detecting the mass flow of compressible vapors and gases, the measurement is unaffected by changes in pressure and/or temperature. One of the capabilities of the thermal mass flow sensors is to accurately measure low gas flow rates or low gas velocities—much lower than can be detected with any other device.

A method for fabricating a multi-purpose MEMS thermopile sensor able to use as a thermal conductivity sensor, a Pirani vacuum sensor and a thermal flow comprising the fabrication steps: providing a p-type (100) single crystal silicon substrate; depositing a HF corrosion resistance dielectric layer over the surface of the silicon substrate; conducting first photolithography process to create an anodization mask pattern; conducting anodization in HF solution to form a porous silicon layer in the restricted regions of the silicon substrate; conducting low temperature oxidization at 300° C. in dry hydrogen for 30 min; depositing a 1000 Angstrom thick polysilicon layer over the surface of the silicon substrate by low pressure chemical vapor deposition (LPCVD); depositing a 5000 Angstrom thick silicon nitride layer over the surface of the polysilicon layer by plasma enhanced chemical vapor deposition (PECVD); depositing a 5000 Angstrom thick polysilicon layer over the surface of the silicon nitride layer; conducting second photolithography process to create a polysilicon pattern including a polysilicon stripe for a heater and several polysilicon stripes for a thermopile; conducting at least one ion implantation to dope the polysilicon stripes; conducting thermal annealing at 950° C. in dry Nitrogen for 30 min; depositing a 8000 Angstrom thick silicon nitride layer by PECVD over the surface of the silicon substrate; conducting third photolithography process to create a silicon nitride pattern; depositing a 1 μm thick Aluminum layer by sputtering; conducting forth photolithography process to create an Aluminum pattern; annealing at 450° C. in forming gas; conducting fifth photolithography process to reveal bonding pads in the silicon nitride layer; depositing a 1 μm thick high density plasma (HDP) silicon dioxide layer over the surface of the silicon substrate; partial thickness cutting of the silicon substrate along an edge of the porous silicon layer and down to the bottom of the porous silicon layer; etching the porous silicon layer in diluted KOH solution to create a cavity replacing the porous silicon layer and a membrane suspending over the cavity; etching HDP silicon dioxide layer in Pad A etchant to remove the HDP silicon dioxide layer and finish the fabrication process for the thermal conductivity sensor, the Pirani vacuum sensor or the thermal flow sensor.

Another method for fabricating a multi-purpose MEMS thermopile sensor able to use as a non-contact infrared temperature sensor comprising the fabrication steps: providing a p-type (100) single crystal silicon substrate; depositing a HF corrosion resistance dielectric layer over the surface of the silicon substrate; conducting first photolithography process to create an anodization mask pattern; conducting anodization in HF solution to form a porous silicon layer in restricted regions of the silicon substrate; conducting low temperature oxidization at 300° C. in dry hydrogen for 30 min; depositing a 1000 Angstrom thick polysilicon layer over the surface of the silicon substrate by low pressure chemical vapor deposition (LPCVD); depositing a 5000 Angstrom thick silicon nitride layer over the surface of the polysilicon layer by plasma enhanced chemical vapor deposition (PECVD); depositing a 4000 Angstrom thick polysilicon layer over the surface of the silicon nitride layer; conducting second photolithography process to create a polysilicon pattern including several narrow polysilicon stripes for a thermopile and a wider polysilicon stripe for an infrared absorber element; conducting at least one ion implantations to dope the narrow polysilicon stripes; conducting thermal annealing at 950° C. in dry Nitrogen for 30 min; depositing a 11000 Angstrom thick silicon dioxide layer by PECVD over the surface of the silicon substrate by PECVD; conducting third photolithography process to create a silicon dioxide pattern; depositing a 1 μm thick Aluminum layer over the surface of the silicon substrate by sputtering; conducting forth photolithography process to create an Aluminum pattern; annealing at 450° C. in forming gas; depositing a 2000 Angstrom thick Titanium on the surface of the silicon substrate by sputtering; depositing 8500 Angstrom thick silicon nitride layer by PECVD over the surface of the silicon substrate; conducting sixth photolithography process to create a Titanium and silicon nitride stack layer pattern; depositing a 1 μm thick high density plasma (HDP) silicon dioxide layer over the surface of the silicon substrate; partial thickness cutting of the silicon substrate along an edge of the porous silicon layer and down to the bottom of the porous silicon layer; etching the porous silicon layer in diluted KOH solution to create a cavity replacing the porous silicon layer and release a membrane over the cavity; etching HDP silicon dioxide layer in Pad A etchant to finish the fabrication process for the non-contact infrared temperature sensor.

Figure 5:
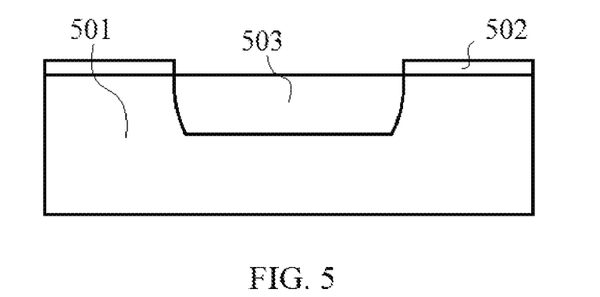
FIG. 5 illustrates the cross-sectional view of a porous silicon layer recessed in a silicon substrate which is formed by electrochemical etching of a silicon substrate in a HF solution using a patterned dielectric layer as an etching mask and represents the first step of a method for manufacturing a multi-purpose MEMS thermopile sensor

Reference to the FIG. 5, the first step of the method for manufacturing a multi-purpose MEMS thermopile sensor is to prepare a (100) single crystal silicon substrate 501. It is preferred that the silicon substrate has a resistivity ranging from 0.1 to 0.001 Ω-cm. A 1200 thick silicon carbide layer is deposited over the surface of the silicon substrate by plasma enhanced chemical vapor deposition (PECVD). The silicon carbide layer cannot be etched by the HF solution. Be careful to control the stress of the silicon nitride layer during the deposition process. As an alternative, a 4000 Angstrom thick silicon nitride layer is deposited over the surface of the silicon substrate by low pressure chemical vapor deposition (LPCVD). It is needed that the silicon nitride layer is silicon-rich silicon nitride layer which is more HF corrosion resistant. A photolithography process is conducted to create an anodization mask pattern 502. Anodization of the silicon substrate is conducted in a HF solution consisting of 49 wt. % HF in water and ethanol. During the anodization process the used HF concentration ranges from 12 to 35 vol % and the used anodic current density ranges from 20 mA to 80 mA/square-cm. The depth of the formed porous silicon layer 503 is preferred to be 15 to 50 μm.

Figure 6:
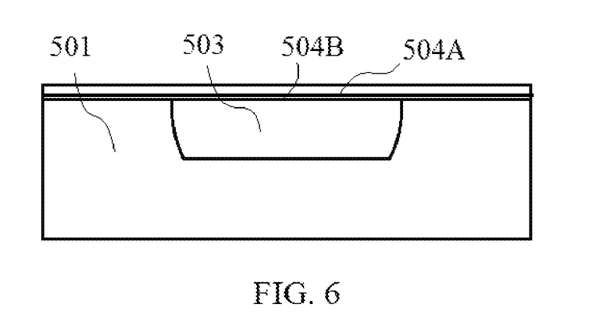
FIG. 6 illustrates the cross-sectional view of a silicon nitride layer deposited over the surface of the silicon substrate with the porous silicon layer therein and presents the second step of the method for manufacturing a multi-purpose MEMS thermopile sensor.

Reference to the FIG. 6, it comprises three fabrication steps. First, the porous silicon layer 503 is oxidized at 350° C. in dry oxygen for 30 min. Second, a 1000 Angstrom thick polysilicon layer 504B is deposited over the surface of the silicon substrate 501 by LPCVD. Third, a 4000 Angstrom thick silicon dioxide layer 504A is deposited over the surface of the polysilicon layer by PECVD. The oxidization of the porous silicon layer is to stabilize the microstructure and slow down reorganization of the porous silicon layer at higher temperature. Also, the polysilicon layer can seal the openings of the pores of the porous silicon layer so as to prevent outgas during the later Aluminum deposition.

The above-mentioned fabrication steps are used for both the sensors able to use as the thermal conductivity sensors, the Pirani vacuum sensor and the thermal flow sensor and the sensors able to use as the non-contact infrared temperature sensor.

Figure 7A:
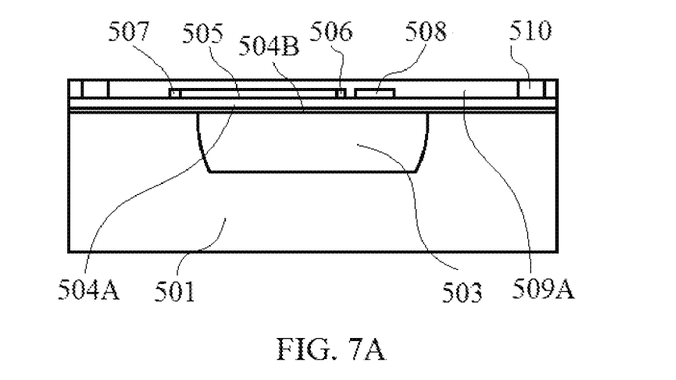
FIG. 7A illustrates the cross-sectional view of several device elements including a thermopile, a heater, an aluminum interconnection and a passivation layer created in the silicon substrate with the porous silicon layer therein and represents the third step of the method for manufacturing a multi-purpose MEMS thermopile sensor which can be configured as a gas flow sensor, a gas thermal conductivity sensor or a Pirani vacuum sensor.

Reference to the FIG. 7A, it follows to the FIG. 6 and the showed fabrication steps are used for the thermal conductivity sensors, the Pirani vacuum sensors and the thermal flow sensors. Firstly, a 5000 angstrom thick polysilicon layer is deposited on the surface of the silicon nitride layer by LPCVD. Another photolithography process is conducted to create a polysilicon pattern. The polysilicon pattern includes N narrow stripes for a thermopile and a wider stripe for a heater. Boron ions are implanted into the narrow strips with implant dose $1 \times 10^{15}/cm^2$ and implant energy 50 keV. As an alternative, the polysilicon pattern includes 2N narrow stripes for a thermopile 505 and a wider stripe for a heater 508. Boron ions are implanted into the first N narrow strips at condition: implant dose $1 \times 10^{15}/cm^2$, implant energy 50 keV and Phosphorus ions are implanted into the second N stripes with implant dose $1 \times 10^{15}/cm^2$ and implant energy 70 keV. The first implanted N narrow stripes construct the P-type legs of the thermopile and the second implanted N narrow stripes construct the N-type legs of the thermopile. Implanted polysilicon stripes are annealed at 950 C in Hydrogen for 30 min. A 11000 Angstrom thick silicon dioxide layer is deposited by PECVD on the surface of the substrate. Third photolithography process is conducted to form a silicon dioxide pattern. A 1 μm thick Aluminum layer is deposited on the surface of the silicon dioxide layer by sputtering and still another photolithography processes is conducted to form an Aluminum pattern which results the thermopile to have N or 2N hot junctions 506 close to the heater, N or 2N cold junctions 507 far from the heater and several bonding pads 510. Annealing is conducted for Aluminum alloying at 450° C. in forming gas for 30 min. A 11000 Angstrom thick silicon nitride layer 509A is deposited over the surface of the substrate 501. Still another photolithography process is conducted to reveal bonding pads. As a result, a thermopile, a heater and an interconnection are formed in the substrate. Each thermocouple of the thermopile consists of an implanted polysilicon leg and an Aluminum leg and the heater is made by Boron implanted polysilicon. As an alternative, each thermocouple of the thermopile consists of a Boron implanted polysilicon leg and a Phosphorus implanted polysilicon leg. The heater is made by Boron implanted polysilicon. The above-mentioned fabrication steps are used for the thermal conductivity sensors, the Pirani vacuum sensors and the thermal flow sensors.

Figure 8A:
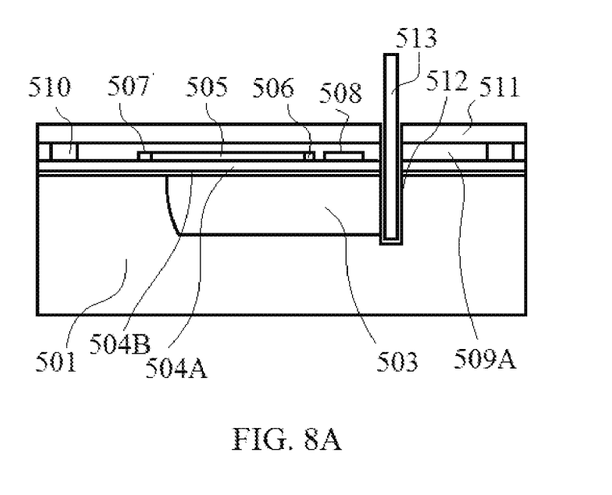
FIG. 8A illustrates the cross-sectional view of a groove partially cut in the silicon substrate with the porous silicon layer, the thermopile, the heater, the aluminum interconnection, the passivation layer and a HDPCVD (high-density plasma chemical vapor deposition) silicon dioxide layer therein and represents the four step of the method for manufacturing a multi-purpose MEMS thermopile sensor which can be configured as the gas flow sensor, the gas thermal conductivity sensor or the Pirani vacuum sensor.

Reference to the FIG. 8A, it follows the FIG. 7A and the showed fabrication steps are used for the thermal conductivity sensors, the Pirani vacuum sensors and the thermal flow sensors. The first step is to deposits a 10000 Angstrom thick high-density silicon dioxide layer 511 is deposited by high density plasma chemical vapor deposition (HDPCVD). The deposition condition is preferred to be: RF power range: 2000-4000 W; Gases: $SiH_4/Ar/O_2$=32-45/0-40/43-60 sccm; pressure: less than 4 mtorr; deposition temperature: 250350° C. and deposition rate: 180-400 nm/min. Then partial cutting of the substrate is conducted by dicing saw 513. The cutting line is along an edge of the porous silicon layer. A preferred depth is in the range of 15 to 50 μm and a preferred width is in the range of 40 to 60 μm. As an alternative, partial cutting of the substrate is conducted by laser dicing and it is preferred that the depth is 15 to 50 μm and the width is 40 to 60 μm. The resulted structure comprises a silicon substrate 501, a porous silicon layer 503, a silicon dioxide layer 504A, a thin polysilicon layer 504B, a thermopile 505 with hot junctions 506 and cold junctions 507, a heater 508, a silicon nitride layer 509A, several bonding pads 510, a HDPCVD layer 511 and a cutting groove 512.

HDPCVD is a special form of PECVD that employs an Inductively Coupled Plasma (ICP) source to generate a higher plasma density than that of a standard parallel plate PECVD system. Higher plasma density provides several advantages: Deposition at lower temperatures than PECVD—typically 80 C-150 C; Higher quality films at lower temperatures; Superior trench-fill capability to provide more planarized films.

Figure 9A:
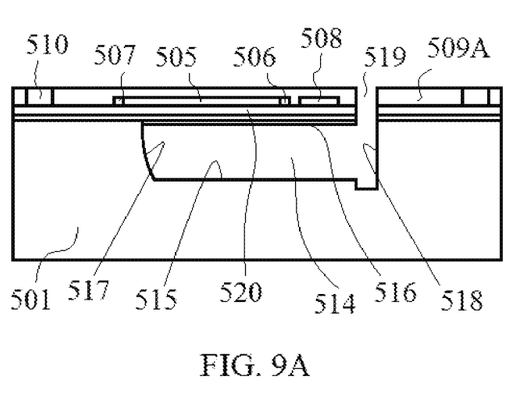
FIG. 9A illustrates the cross-sectional view of a finished thermopile sensor consisting of a cavity recessed into a silicon substrate, a membrane disposed over the cavity, a thermopile and a heater disposed on the membrane and a silicon dioxide layer covering the thermopile and heater and leaving the bonding pads of the aluminum interconnection to be exposed to the surrounding environment of the sensor and represents the final step of the method for manufacturing a multi-purpose MEMS thermopile sensor which can be configured as a gas flow sensor, a thermal conductivity sensor or Pirani vacuum sensor.

Reference to the FIG. 9A, it follows the FIG. 8A and the showed fabrication steps are used for the thermal conductivity sensors, the Pirani vacuum sensors and the thermal flow. Firstly, etching of the porous silicon layer is conducted in a diluted KOH solution. After etching the fabrication process is finally finished. As shown in the FIG. 9A, a cavity 514 is formed by selective etching of the porous silicon layer. The cavity 514 has a flat bottom 515, three curved side walls 517, one vertical side wall 518 and a vertical notch 519. The cavity releases the silicon dioxide layer 504A and the thin polysilicon layer 504B resulting a membrane 520 suspends over the cavity. A thin reorganized porous silicon layer 516 is attached on the back side of the membrane which is the residue layer after the etching of the porous silicon layer. The membrane is separated from the silicon substrate on one side by the notch 509. The notch 509 also provides an opening for the cavity to communicate with an outside of the sensor. The other device elements of the sensor do not change except the thermopile is located above the cavity 514 instead of the porous silicon layer. The unchanged device elements include the hot junction 506 close to the notch 519, the cold junction 507 connected to the silicon substrate 501, the heater 508A is close to the hot junction 506, and the silicon dioxide layer 509 covers the entail surface of the silicon substrate 501 and leaves several bonding pads 510 to be revealed.

Figure 7B:
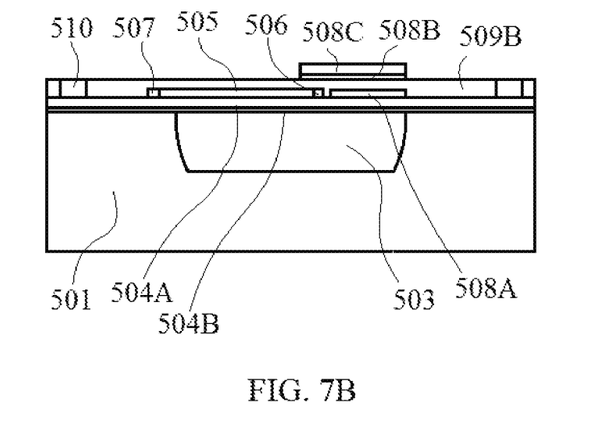
FIG. 7B illustrates the cross-sectional view of several device elements including a thermopile, an infrared absorber, an aluminum interconnection and a passivation layer created in the silicon substrate with the porous silicon layer therein and represents the third step of the method for manufacturing a multi-purpose MEMS thermopile sensor which can be configured as a non-contact temperature sensor.

Reference to the FIG. 7B, it follows the FIG. 6 but the showed fabrication steps are used for a non-contact infrared temperature sensor. The fabrication steps comprise: a 5000 angstrom thick polysilicon layer deposited over the surface of the silicon nitride layer 504B by LPCVD. Then a photolithography processes is conducted to create a polysilicon pattern. The polysilicon pattern includes N narrow stripes for a thermopile 505 and a wider stripe for a first infrared absorber element 508A. Boron ions are implanted into N narrow stripes with implant pose $1\times10^{15}/cm^2$ and implant energy 70 keV. As an alternative, the polysilicon pattern includes 2N narrow stripes for the thermopile 505 and a wider stripe for the first infrared absorber element 508A of the infrared absorber. Boron ions are implanted into the first N narrow stripes at condition: implant pose $1\times10^{15}/cm^2$ and implant energy 50 keV. Phosphorus ions are implanted into the second N narrow stripes at condition: implant phosphorus dose $1\times10^{15}/cm^2$, implant energy 70 keV. The first implanted N narrow stripes construct the P-type legs of the thermopile 505 and the second implanted N narrow stripes construct the N-type legs of the thermopile 505. The implanted polysilicon stripes are annealed at 950 C in Hydrogen for 30 min. A 11000 Angstrom thick silicon dioxide layer 509B is deposited by PECV on the surface of the silicon substrate. Another photolithography process is conducted to create a silicon dioxide pattern which contains revealed regions for subsequent Aluminum connection. A 1 μm thick Aluminum layer is deposited over the surface of the silicon substrate by sputtering. Still another photolithography process is conducted to create an Aluminum pattern including bonding pads 510. Thermal annealing is conducted at 450° C. in forming gas for 30 min. A 2000 Angstrom Titanium layer is deposited over the surface of the silicon substrate by sputtering. Then a 8500 Angstrom thick silicon nitride layer is deposited over the surface of the silicon substrate. Still another photolithography process is conducted to create other elements 508B and 508C of the infrared absorber. As a result, a thermopile 505 has a hot junction 506 and a cold junction 507, an infrared absorber having the first infrared absorber element 508A, a part of the silicon dioxide layer 509B, the second infrared absorber element 508B, and the third infrared absorber element 508C, and several interconnections including bonding pads 510 are formed on the surface of the silicon substrate 501.

Figure 8B:
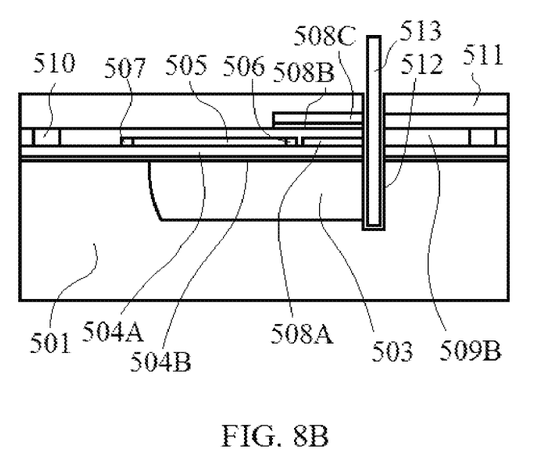
FIG. 8B illustrates the cross-sectional view of a groove partially cut in the silicon substrate with the porous silicon layer, the thermopile, the infrared absorber, the aluminum interconnection, the passivation layer therein and a HDPCVD (high-density plasma chemical vapor deposition) silicon dioxide layer therein and represents the four steps of the method for manufacturing a multi-purpose MEMS thermopile sensor which can be configured as the non-contact temperature sensor.

Reference to the FIG. 8B, it shows the FIG. 7B and the showed fabrication related to the non-contact infrared temperature. The fabrication steps include a 10000 Angstrom thick high-density silicon dioxide layer 511 deposited by high density plasma chemical vapor deposition (HDPCVD). The deposition condition is preferred to be: RF power range: 2000-4000 W; Gases: $SiH_4/Ar/O_2$=32-45/0-40/43-60 sccm; pressure: less than 4 mtorr; deposition temperature: 250-350° C. and deposition rate: 180-400 nm/min. The partial cutting of the silicon substrate 501 is conducted by dicing saw 513. The cutting line 512 is arranged to be along an edge of the porous silicon layer 503 with a preferred depth of 20 to 30 μm and a preferred width of 40 to 60 μm. As an alternative, partial cutting of the silicon substrate 501 is conducted by laser dicing and it is preferred that the depth is 20 to 30 μm and the width is 40 to 60 a. As can be seen from the FIG. 8B, the infrared absorber is a multilayer stacked which consists of a polysilicon layer 508a, a titanium layer 508b and a silicon nitride layer 508c. The other layers are another polysilicon layer 504B, another silicon nitride layer 504A and a silicon dioxide layer 509B. So the infrared absorber can be simply expressed as a stack layer of $Si_3N_4/Ti/SiO_2/polySi/Si_3N_4/polySi$.

The infrared absorber is based on a multilayer geometry consisting of transparent dielectric layers interspersed with thin metallic layers for absorption. Each successive metallic layer absorbs a small fraction of the radiation. For normal incidence, Bragg reflection peaks will occur only near wavelengths given by $\lambda$=2 nd/m, where n is the index of refraction of the dielectric layers, d is the thickness of the dielectric layers, and m is a positive integer. Tuning the absorption to a specific frequency range can be performed by choosing the dielectric thickness such that the range of interest is in the middle of the range between Bragg reflection peaks. The reflection peaks can be made narrow by using a large number of layers. In the spectral region between the narrow reflection peaks, the structure absorbs the radiant energy by Joule heating in the metal films.

Figure 9B:
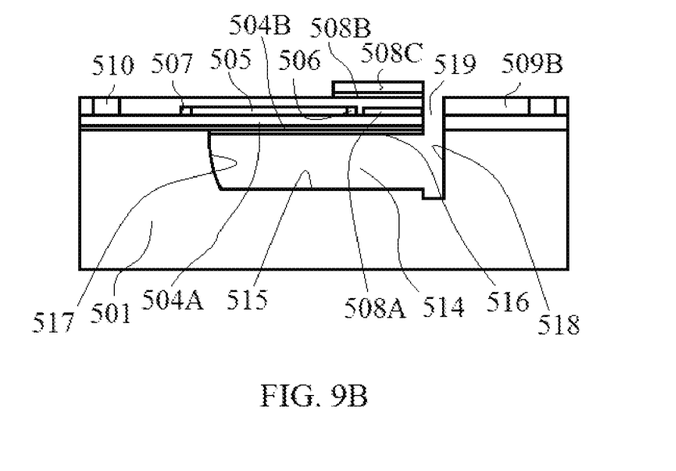
FIG. 9B illustrates the cross-sectional view of a finished thermopile sensor consisting of a cavity recessed into a silicon substrate, a membrane disposed over the cavity, a thermopile disposed on the membrane, an infrared absorber disposed on a silicon dioxide layer covering the thermopile and leaving the bonding pads of the aluminum interconnection to be exposed to the surrounding environment of the sensor and represents the fifth step of the method for manufacturing a multi-purpose MEMS thermopile sensor which can be configured as the non-contact temperature sensor.

Reference to the FIG. 9B, it shows more continuing fabrication processes of the non-contact infrared temperature sensor. The related steps include etching of the porous silicon layer is conducted in a diluted KOH solution. The etching results in a structure comprising a cavity 514 formed in the silicon substrate 501. The cavity 514 has a flat bottom 515, three curved side walls 517, a vertical side wall 518 and a notch 519. Through the notch 519 the cavity 514 communicates with the outside of the sensor. A membrane 520b suspends over the cavity 514 and has a thin polysilicon layer 520b and a thin reorganized porous silicon layer 516 both attached on its back side, a thermopile 514 is positioned on the surface of the membrane 504. As above mentioned, the thermopile 514 has the hot junction 506 close to the notch 519 and the cold junction 507 extends to the silicon substrate 501. The infrared absorber element 508a positioned between the free side of the membrane 520b and the hot junction 506 of the thermopile 505. A silicon dioxide layer 509A covers the entail surface of the silicon substrate 501 and leaves several bonding pads 510 to be revealed.

Figure 10B:
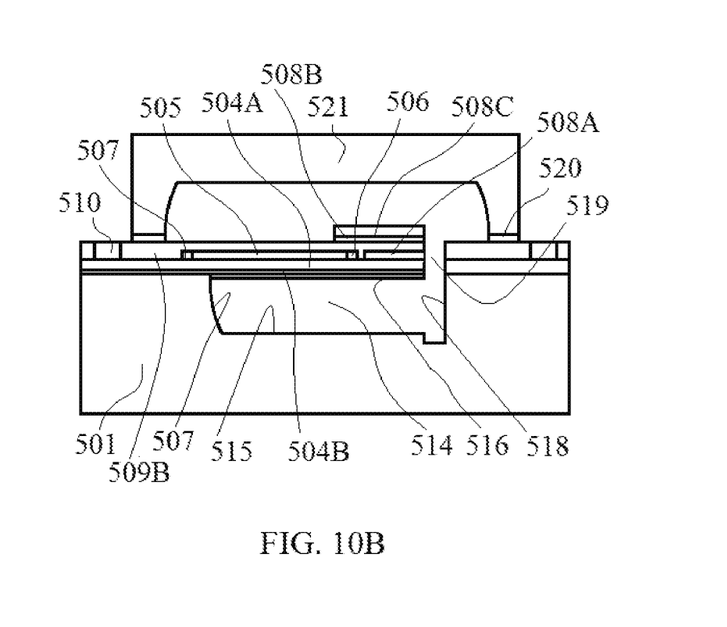
FIG. 10B illustrates the cross-sectional view of a non-contact infrared temperature sensor chip with a silicon lid chip bonded on its surface which acts as an infrared radiation entrance window.

Reference to the FIG. 10B, it shows still more continuing fabrication processes of the non-contact infrared temperature sensor and mainly relates to silicon wafer bonding. A silicon lid wafer 521 is bonded to the sensor wafer and the bonding pads 510 are routed out of the lid using thru-lid-vias. The lid wafer is prepared to have a cavity positioned at the central region of each chip and a seal ring metal stack of Ti/Pt/Au/Ge/Au on the round edge of each chip. The sensor wafer is prepared to have a seal ring metal stack of Ti/Pt/Au on the round edge of each chip which is isolated from the bonding pads by depositing of an ALN layer. The lid wafer and the sensor wafer are bonded in vacuum or in a nitrogen environment at or above the Au—Ge Eutectic temperature 363° C. The bonded wafers were then thinned and polished first on the sensor side and then on the lid side. The sensor side is thinned to 100 µm thick with a nearly scratch-free and crack-free surface. The lid side is similarly thinned to 120 µm thick exposing the bonding pads. After thinning, a 100 µm thick lid remained protecting the sensor features and providing a high hermetic micro-environment. Thinned Sensor/Lid wafer-level assemblies were then sawed into individual sensors.

After bonding the sensor comprises a cavity 514 formed in the silicon substrate 501. The cavity 514 has a flat bottom 515, three curved side walls 517, a vertical side wall 518 and a notch 519. Through the notch 519 the cavity 514 communicates with the outside of the sensor. A membrane 520b suspends over the cavity 514 and has a thin polysilicon layer 520b and a thin reorganized porous silicon layer 516 both attached on its back side, a thermopile 514 is positioned on the surface of the membrane 504. The other device elements as the same to the above mentioned.

While various embodiments have been described, the description is intended to be exemplary, rather than limiting and it will be apparent to those of ordinary skill in the art that many more embodiments and implementations are possible that are within the scope of the embodiments herein. Accordingly, the embodiments are not to be restricted except in light of the attached claims and their equivalents. Also, various modifications and changes may be made within the scope of the attached claims.

What is claimed is:

1. A method for fabricating a multi-purpose MEMS thermopile sensor able to configure as a thermal conductivity sensor, a Pirani vacuum sensor or a thermal flow sensor comprises the fabrication steps: providing a p-type single crystal silicon substrate; depositing a HF corrosion resistance dielectric layer on the surface of the silicon substrate; conducting first photolithography process to form an anodization mask pattern; conducting anodization in HF solution to form a porous silicon layer in restricted regions of the silicon substrate; conducting low temperature oxidization at 300° C. in dry Oxygen for 30 min; depositing a 1000 Angstrom thick polysilicon layer over the surface of the silicon substrate by low pressure chemical vapor deposition (LPCVD); depositing a 5000 Angstrom thick silicon nitride layer over the surface of the polysilicon layer by plasma enhanced chemical vapor deposition (PECVD); depositing a 5000 Angstrom thick polysilicon layer over the surface of the silicon nitride layer by LPCVD; conducting second photolithography process to create a polysilicon pattern including a polysilicon stripe for a heater and several polysilicon stripes for a thermopile; conducting at least one ion implantations to dope the polysilicon stripes; conducting thermal annealing at 950° C. in dry Nitrogen for 30 min; depositing a 1 µm thick Aluminum layer by sputtering; conducting third photolithography process to create an Aluminum pattern; annealing at 450° C. in forming gas; depositing a 6000 Angstrom thick silicon nitride layer by PECVD over the surface of the silicon substrate; conducting fourth photolithography process to reveal several bonding pads; depositing a 1 µm thick high density plasma (HDP) silicon dioxide layer over the surface of the silicon substrate; partial thickness cutting of the silicon substrate along an edge of the porous silicon layer; etching the porous silicon layer in a diluted KOH solution to create a cavity replacing the porous silicon layer and release the stack layer over the porous silicon layer which results in a suspending thin membrane.

2. The method for fabricating a multi-purpose MEMS thermopile sensor according to claim 1, wherein the p-type single crystal silicon substrate has a resistivity ranging from 0.1 to 0.001 ohm-cm.

3. The method for fabricating a multi-purpose MEMS thermopile sensor according to claim 1, wherein the HF corrosion resistance dielectric material layer is a 1200 Angstrom thick silicon carbide layer deposited by PECVD.

4. The method for fabricating a multi-purpose MEMS thermopile sensor according to claim 1, wherein the HF corrosion resistance dielectric material layer, as an alternative, is a 4000 Angstrom thick silicon nitride layer deposited by LPCVD.

5. The method for fabricating a multi-purpose MEMS thermopile sensor according to claim 1, wherein the anodization is performed in a HF solution consisting of 49 wt. % HF in water and ethanol, having a HF concentration ranging from 12 to 35 vol % and at an anodic current density ranging from 20 mA to 80 mA/cm$^2$.

6. The method for fabricating a multi-purpose MEMS thermopile sensor according to claim 1, wherein the low temperature oxidization of the porous silicon layer stabilizes the microstructure of the porous silicon layer.

7. The method for fabricating a multi-purpose MEMS thermopile sensor according to claim 1, wherein the 1000 Angstrom thick polysilicon prevents the porous silicon layer from release gas during a later Aluminum layer deposition.

8. The method for fabricating a multi-purpose MEMS thermopile sensor according to claim 1, wherein the ion implantation uses boron as implant source and conducted at implant dose $4\times10^{15}/cm^2$ and implant energy 70 keV.

9. The method for fabricating a multi-purpose MEMS thermopile sensor according to claim 1, wherein the ion implantation uses phosphorous as implant ion source and conducted at implant dose $4\times10^{15}/cm^2$ and implant energy 100 keV.

10. The method for fabricating a multi-purpose MEMS thermopile sensor according to claim 1, wherein the thermopile consists of several thermocouples each of them is constructed by a boron ion doped polysilicon stripe and a phosphorous ion doped poly silicon stripe.

11. The method for fabricating a multi-purpose MEMS thermopile sensor according to claim 1, wherein the thermopile consists of several thermocouples each of them is constructed by a boron ion doped polysilicon stripe and an Aluminum stripe.

12. The method for fabricating a multi-purpose MEMS thermopile sensor according to claim 1, wherein the partial cutting of the silicon substrate is conducted by a dicing saw machine.

13. The method for fabricating a multi-purpose MEMS thermopile sensor according to claim 1, wherein the partial thickness cutting of the silicon substrate is conducted by a laser dicing machine.

14. The method for fabricating a multi-purpose MEMS thermopile sensor according to claim 1, wherein the partial thickness is proffered to 20 to 30 μm in depth and 40 to 60 μm in width.

15. The method for fabricating a multi-purpose MEMS thermopile sensor according claim 1, wherein the high density plasma silicon dioxide film is deposited at the conditions: RF power range: 2000-4000 W; Gases: $SiH_4$/Ar/O2=32-45/0-40/43-60 sccm; Pressure: less than 4 mtorr; Deposition temperature: 250-350° C. and Deposition rate: 180-400 nm/min.

16. A method for fabricating a multi-purpose MEMS thermopile sensor able to configure as a non-contact infrared temperature sensor comprises the fabrication steps: providing a p-type single crystal silicon substrate; depositing a HF corrosion resistance dielectric layer on the surface of the silicon substrate; conducting first photolithography process to form an anodization mask pattern; conducting anodization in HF solution to form a porous silicon layer in restricted regions of the silicon substrate; conducting low temperature oxidization at 300° C. in dry Oxygen for 30 min; depositing a 1000 Angstrom thick polysilicon layer over the surface of the silicon substrate by low pressure chemical vapor deposition (LPCVD); depositing a 5000 Angstrom thick silicon nitride layer over the surface of the polysilicon layer by plasma enhanced chemical vapor deposition (PECVD); depositing a 4000 Angstrom thick polysilicon layer over the surface of the silicon nitride layer by LPCVD; conducting second photolithography process to create a polysilicon pattern including several small polysilicon stripes for a thermopile and a large polysilicon stripe for an element of an infrared absorber; conducting at least one ion implantations to dope the small polysilicon stripes; conducting thermal annealing at 950° C. in dry Nitrogen for 30 min; depositing a 11000 Angstrom thick silicon dioxide layer by PECVD over the surface of the silicon substrate; conducting third photolithography process to create a silicon dioxide pattern; depositing a 1 μm thick Aluminum layer by sputtering; conducting fourth photolithography process to create an Aluminum pattern; annealing at 450° C. in forming gas; depositing a 2000 Angstrom thick titanium layer over the surface of the silicon substrate; depositing 8500 Angstrom thick silicon nitride layer over the surface of the silicon substrate; conducting fifth photolithography process to form another element of the infrared absorber and still another element of the infrared absorber; depositing a 1 μm thick high density plasma (HDP) silicon dioxide layer over the surface of the silicon substrate; partial thickness cutting of the silicon substrate along an edge of the porous silicon layer; etching the porous silicon layer in a diluted KOH solution to create a cavity replacing the porous silicon layer and release the stack layer over the porous silicon layer which results in a suspending thin membrane and a sensor chip; bonding a silicon lid on the top of the sensor chip to finish the fabrication process.

17. The method for fabricating a multi-purpose MEMS thermopile sensor according to claim 16, wherein the infrared absorber is a multilayer geometry consisting of $Si_3N_4$/Ti/$SiO_2$/polySi/$Si_3N_4$/polySi.

18. The method for fabricating a multi-purpose MEMS thermopile sensor according to claim 16, wherein the lid chip is prepared to have a cavity positioned at the central region and a seal ring metal stack of Au/Ge/Au/Pt/Ti on the round edge.

19. The method for fabricating a multi-purpose MEMS thermopile sensor according to claim 16, wherein the sensor chip is prepared to have a seal ring metal stack of Au/Pt/Ti on the round edge of each chip which is isolated from the bonding pads by depositing of an AlN layer.

20. The method for fabricating a multi-purpose MEMS thermopile sensor according to claim 16, wherein the bonding is conducted in vacuum or in Nitrogen environment at or above the Au—Ge Eutectic temperature 363° C.

* * * * *